(12) United States Patent
Moon et al.

(10) Patent No.: US 8,588,343 B2
(45) Date of Patent: Nov. 19, 2013

(54) APPARATUS FOR CALIBRATING AMPLITUDE AND PHASE ERRORS, MULTIPORT AMPLIFIER INCLUDING THE SAME, AND METHOD OF AMPLIFYING THE MULTIPORT AMPLIFIER

(75) Inventors: Seong Mo Moon, Daejeon (KR); Dong Hwan Shin, Daejeon (KR); In Bok Yom, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/495,435

(22) Filed: Jun. 13, 2012

(65) Prior Publication Data

US 2012/0319771 A1 Dec. 20, 2012

(30) Foreign Application Priority Data

Jun. 14, 2011 (KR) .................. 10-2011-0057560
Jun. 1, 2012 (KR) .................. 10-2012-0059390

(51) Int. Cl.
*H03D 3/22* (2006.01)
*H04L 27/22* (2006.01)

(52) U.S. Cl.
USPC ........................................ 375/329

(58) Field of Classification Search
None
See application file for complete search history.

(56) References Cited

U.S. PATENT DOCUMENTS 5,068,668 A * 11/1991 Tsuda et al. ............... 342/362
2010/0156528 A1 6/2010 Couchman et al.

OTHER PUBLICATIONS

P. James, Optimization of a Multi-port Amplifier Using a Least Squares Evolutionary Relaxation Method, Sep. 2006,36th European, EADS Astrium Ltd, Portsmouth Hampshire, PO3 5PU, UK.

\* cited by examiner

*Primary Examiner* — Chieh M Fan
*Assistant Examiner* — Wednel Cadeau
(74) *Attorney, Agent, or Firm* — William Park & Associates Patent Ltd.

(57) ABSTRACT

A multiport amplifier modulates a reference quadrature phase shift keying (QPSK) signal using an input RF signal to an input hybrid network, generates a plurality of binary phase shift keying (BPSK) signals by demodulating RF signals that are amplified by a plurality of power amplifiers, detects an amplitude error and a phase error of two corresponding amplified RF signals by comparing a QPSK signal that is generated by coupling two RF signals having a phase difference of 90° among the plurality of BPSK signals with a reference QPSK signal, and compensates the detected amplitude error and phase error.

17 Claims, 12 Drawing Sheets

US 8,588,343 B2

APPARATUS FOR CALIBRATING AMPLITUDE AND PHASE ERRORS, MULTIPORT AMPLIFIER INCLUDING THE SAME, AND METHOD OF AMPLIFYING THE MULTIPORT AMPLIFIER

CROSS-REFERENCE TO RELATED APPLICATION

This application claims priority to and the benefit of Korean Patent Application No. 10-2011-0057560 and 10-2012-0059390 filed in the Korean Intellectual Property Office on Jun. 14, 2011 and Jun. 1, 2012, the entire contents of which are incorporated herein by reference.

BACKGROUND OF THE INVENTION (a) Field of the Invention

The present invention relates to an apparatus for calibrating amplitude and phase errors, a multiport amplifier including the same, and a method of amplifying the multiport amplifier. More particularly, the present invention relates to a method and apparatus for simultaneously detecting and calibrating phase and magnitude errors in a multiport amplifier.

(b) Description of the Related Art

A multiple beam antenna system that can provide narrow beams having a high antenna gain within a service coverage area is widely used as a mounting body system of a communication and broadcasting satellite due to excellent equivalent isotropically radiated power (EIRP) and G/T performance, which is a ratio of a gain G of an antenna and a noise temperature T.

In the multiple beam antenna system, a multiport amplifier that can perform output power control according to an operation condition is widely used.

The multiple beam antenna system using a multiport amplifier installs several spot beams within a service area to provide communication and broadcasting services and flexibly provides high power allocation to an area requiring higher EIRP due to rainfall or a rapid increase of a communication service. Further, because the multiport amplifier combines and uses high power amplifiers having the highest failure rate in parallel among components for a satellite repeater, when using the multiport amplifier, a system can be formed using a high power amplifier redundancy of a fewer number, compared with when using an existing satellite repeater.

The multiport amplifier has a plurality of input terminals and output terminals and the number of input terminals and output terminals may be $2^n$, but in consideration of ease of embodiment or optimal performance, the most available structures are a 4×4 structure and an 8×8 structure.

The multiport amplifier generally operates using hybrid matrix characteristics, and an operation principle of such a multiport amplifier is achieved when connection components such as input and output hybrid networks, a power amplifier, and other transmission lines perform an ideal operation.

Actually, when embodying a multiport amplifier, a hybrid matrix has a difference in insertion loss of terminals and has an error in phases. In a power amplifier, by nonlinearity, a phase of an output signal has different values according to the magnitude of an input signal. When connection components such as a transmission line are not manufactured in the same size and form, the amplitude (magnitude) and phase of a signal may be changed. In this way, in components constituting a multiport amplifier, when an error occurs in an amplitude and a phase, as in an ideal operation, an in-phase or out-of-phase condition of signals that are distributed in input and output hybrid networks is not achieved and thus isolation performance between input terminals and output terminals of the multiport amplifier is deteriorated.

In order to solve such a problem, the multiport amplifier includes a signal magnitude and phase calibration circuit. In order to prevent power loss of an output terminal, the magnitude and phase calibration circuit is disposed at a front stage of the power amplifier, and in an output hybrid network, the multiport amplifier maintains magnitude and phase differences of a signal, as in a ideal multiport amplifier, thereby performing a function of improving isolation performance of the multiport amplifier. In the phase and magnitude calibration circuit, values of a phase and a magnitude are determined as values that can embody optimum performance while including actual performance of each component when embodying a multiport amplifier system. However, when a change occurs in the performance of constituent elements of a multiport amplifier by an environment condition change such as degradation of a component performance or a temperature change, the performance of the multiport amplifier cannot be maintained in an optimal state.

SUMMARY OF THE INVENTION

The present invention has been made in an effort to provide an apparatus for calibrating amplitude and phase errors, a multiplex amplifier including the same, and a method of amplifying the multiplex amplifier having advantages of maintaining performance of the multiport amplifier in an optimal state, even if an environment condition changes.

An exemplary embodiment of the present invention provides a multiport amplifier. The multiport amplifier includes an input hybrid network, a plurality of power amplifiers, an output hybrid network, an error detector, and a plurality of amplitude and phase controllers. The input hybrid network generates a plurality of RF signals using an input RF signal. The plurality of power amplifiers amplify and output the plurality of RF signals, respectively. The output hybrid network generates at least one output RF signal from output signals of the plurality of power amplifiers. The error detector generates at least one quadrature phase shift keying (QPSK) signal using the input RF signal and the output signals of the plurality of power amplifiers, and detects an amplitude error and a phase error of the output signals of the plurality of power amplifiers by comparing the at least one QPSK signal and the reference QPSK signal. The plurality of amplitude and phase controllers control amplitudes and phases of the plurality of RF signals according to the amplitude error and the phase error.

The error detector may include a modulator, a plurality of BPSK demodulators, and a QPSK signal generator. The modulator may modulate the reference QPSK signal to an RF signal by the input RF signal. The plurality of BPSK demodulators may demodulate a reference QPSK signal that is modulated to the RF signal to an I signal or a Q signal using each of the output signals of the plurality of power amplifiers. The QPSK signal generator may generate the at least one QPSK signal by coupling a pair of an I signal and a Q signal of an I signal or a Q signal of the plurality of BPSK demodulators.

The error detector may further include a signal analyzer that detects an amplitude error and a phase error by comparing the reference QPSK signal and the one generated QPSK signal. An amplitude and phase controller that is related to the one generated QPSK signal among the plurality of amplitude and phase controllers may control amplitude and phase of a corresponding RF signal according to the detected amplitude error and phase error.

The error detector may further include a phase converter that changes a phase of the reference QPSK signal that is modulated to the RF signal based on phase delay of the at least one QPSK signal.

The error detector may further include a signal selector that selects an output signal of two BPSK demodulators that receive an input of an output signal of two power amplifiers having a phase difference of 90° among the plurality of BPSK demodulators and that outputs the output signal to the QPSK signal generator.

The plurality of BPSK demodulators may each include: a phase converter that converts a phase of the output signal of the input power amplifier by 180°; a first RF coupler that adds and outputs a signal having a phase that is converted by 180° and a reference QPSK signal that is modulated to the RF signal; a second RF coupler that adds and outputs an output signal of the input power amplifier and a reference QPSK signal that is modulated to the RF signal; first and second low pass filters that detect only a signal of a baseband from output signals of the first and second RF couplers; and an analog decoder that generates an I signal or a Q signal of a baseband from a difference between signals of the baseband that are detected from each of the first and second low pass filters.

Another embodiment of the present invention provides a method of amplifying a multiport amplifier. The method includes: distributing an input RF signal to a plurality of RF signals having the same amplitude and phase difference; amplifying each of the plurality of RF signals; generating at least one output RF signal by distributing each of the amplified plurality of RF signals to a plurality of RF signals having the same magnitude and phase difference; and controlling amplitudes and phases of the plurality of RF signals using at least one QPSK signal that is generated from a reference QPSK signal and the amplified plurality of RF signals.

The controlling of amplitudes and phases may include: demodulating the plurality of RF signals to a plurality of binary phase shift keying (BPSK) signals, respectively; generating a QPSK signal using two BPSK signals having a phase difference of 90° among the plurality of BPSK signals; detecting an amplitude error and a phase error by comparing the reference QPSK signal and the generated QPSK signal; and calibrating amplitudes and phases of two RF signals that are related to the generated QPSK signal among the amplified plurality of RF signals with the amplitude error and the phase error.

The calibrating of amplitudes and phases may include calibrating a phase and an amplitude of the other RF signal based on one RF signal of the two RF signals.

The demodulating of the plurality of RF signals may include: modulating the reference QPSK signal to an RF signal using the input RF signal; and demodulating a reference QPSK signal that is modulated to the RF signal to the plurality of BPSK signals using each of the amplified plurality of RF signals.

The demodulating of the plurality of RF signals may further include changing a phase of a reference QPSK signal that is modulated to the RF signal based on phase delay of the generated QPSK signal.

Yet another embodiment of the present invention provides an apparatus that compensates an amplitude and a phase of a multiple signal in a multiport amplifier including an input hybrid network that distributes an input RF signal to a plurality of RF signals, a plurality of power amplifiers that amplify a plurality of RF signals, and an output hybrid network that generates at least one output signal from the plurality of amplified RF signals. The apparatus includes a modulator, a plurality of BPSK demodulators, a QPSK signal generator, a signal analyzer, and a plurality of amplitude and phase controllers. The modulator modulates a reference QPSK signal to an RF signal using the input RF signal. The plurality of BPSK demodulators generate a plurality of BPSK signals by demodulating the plurality of amplified RF signals. The QPSK signal generator generates at least one QPSK signal by coupling two BPSK signals having a phase difference of 90° among the plurality of BPSK signals. The signal analyzer detects an amplitude error and a phase error by comparing the reference QPSK signal and each of the at least one generated QPSK signal. The plurality of amplitude and phase controllers control amplitudes and phases of a plurality of RF signals according to the amplitude error and the phase error.

The apparatus may further include a signal selector that selects two BPSK signals having a phase difference of 90° among the plurality of BPSK signals.

The apparatus may further include a phase converter that compensates phase delay of the generated QPSK signal.

The phase converter may change a phase of the reference QPSK signal according to a phase change amount of the generated QPSK signal.

DETAILED DESCRIPTION OF THE EMBODIMENTS

Figure 1:
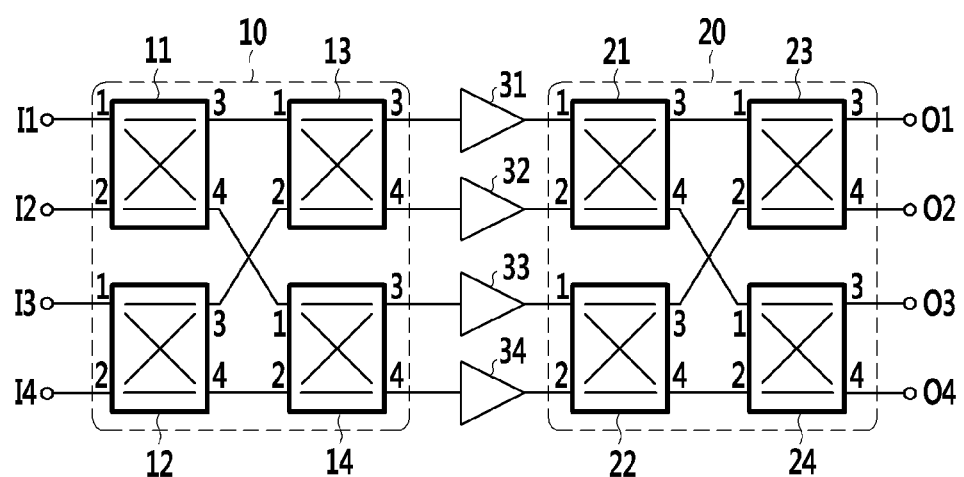
FIG. 1 is a drawing illustrating a concept of a general multiport amplifier.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, in the entire specification and claims, unless explicitly described to the contrary, the word "comprise" and variations such as "comprises" or "comprising" will be understood to imply the inclusion of stated elements but not the exclusion of any other elements.

Hereinafter, an apparatus for calibrating amplitude and phase errors, a multiport amplifier including the same, and a method of amplifying the multiport amplifier according to an exemplary embodiment of the present invention will be described in detail with reference to the drawings.

Figure 2:
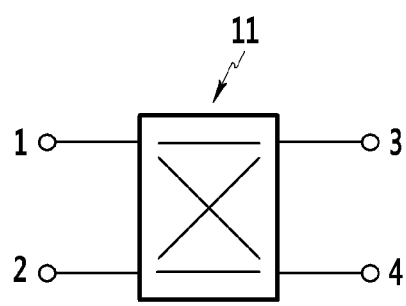
FIG. 2 is a diagram illustrating an example of a hybrid that is shown in FIG. 1.

FIG. 1 is a drawing illustrating a concept of a general multiport amplifier, and FIG. 2 is a diagram illustrating an example of a hybrid that is shown in FIG. 1.

FIG. 1 illustrates 4×4 multiport amplifiers as an example of a multiport amplifier.

The 4×4 multiport amplifiers of FIG. 1 include four input terminals I1-I4, four output terminals O1-O4, an input hybrid network 10, an output hybrid network 20, and four power amplifiers 31-34.

The input hybrid network 10 includes four hybrids 11-14, and the output hybrid network 20 also includes four hybrids 21-24.

As shown in FIG. 2, each of the hybrids 11-14 includes two input terminals 1 and 2 and two output terminals 3 and 4, divides a signal that is input to the input terminal 1 into signals of two paths having the same amplitude (magnitude) and phase difference, combines signals advancing to the same output terminals 3 and 4, and outputs the combined signal to the output terminals 3 and 4.

The two input terminals 1 and 2 of the two hybrids 11 and 12 form four input terminals I1-I4 of the 4×4 multiport amplifiers, and the two output terminals 3 and 4 of the two hybrids 13 and 14 are connected to the four power amplifiers 31-34, respectively. One output terminal 3 of the hybrid 11 is connected to one input terminal 1 of the hybrid 13, the other output terminal 4 of the hybrid 11 is connected to one input terminal 1 of the hybrid 14, one output terminal 3 of the hybrid 12 is connected to the other input terminal 2 of the hybrid 13, and the other output terminal 4 of the hybrid 12 is connected to the other input terminal 2 of the hybrid 14.

As the input hybrid network 10 operates using operation characteristics of the hybrids 11-14, one input RF signal is divided into four RF signals and output.

The four power amplifiers 31-34 amplify each of output signals of the input hybrid network 10 and output the output signals to the output hybrid network 20.

The output hybrid network 20 includes the four hybrids 21-24, and each of the hybrids 21-24 is formed as shown in FIG. 2.

The two input terminals 1 and 2 of the two hybrids 21 and 22 are connected to the four power amplifiers 31-34, and the two output terminals 3 and 4 of the two hybrids 23 and 24 form four output terminals O1-O4 of the 4×4 multiport amplifiers. One output terminal 3 of the hybrid 21 is connected to one input terminal 1 of the hybrid 23, other output terminal 4 of the hybrid 21 is connected to one input terminal 1 of the hybrid 24, one output terminal 3 of the hybrid 22 is connected to the other input terminal 2 of the hybrid 23, and the other output terminal 4 of the hybrid 22 is connected to the other input terminal 2 of the hybrid 24.

As each of the hybrids 21-24 operates using operation characteristics of the hybrids 21-24, one amplified RF signal is output from four RF signals that are amplified by four power amplifiers 31-34.

Figure 3:
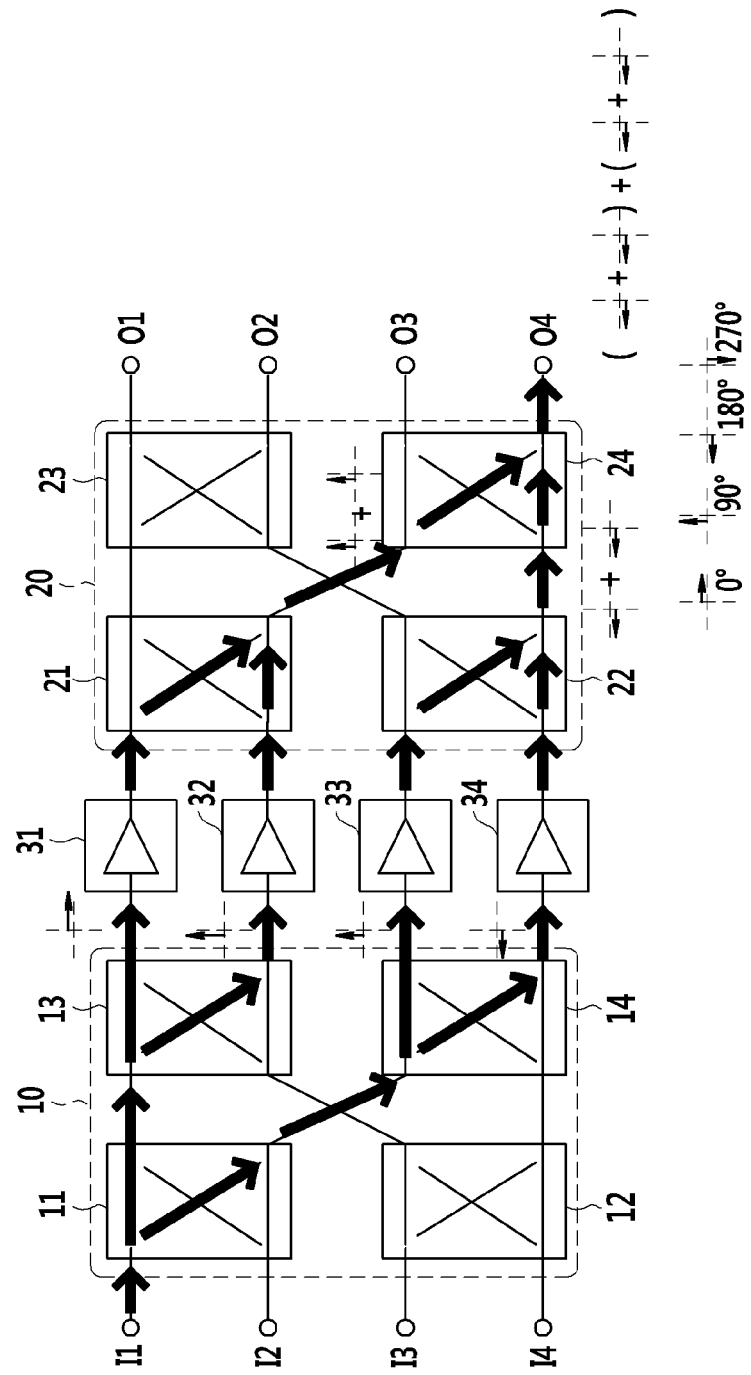
FIG. 3 is a diagram illustrating operation of a multiport amplifier that is shown in FIG. 1.

FIG. 3 is a diagram illustrating operation of a multiport amplifier that is shown in FIG. 1.

As shown in FIG. 3, when an RF signal of a frequency f1 is input to the input terminal 1 of the hybrid 11, which is the input terminal I1, the input RF signal is divided into signals of two paths having the same amplitude and a phase difference of 90° by the hybrid 11, and is output to two output terminals 3 and 4 of the hybrid 11. That is, signals that are output to the two output terminals 3 and 4 of the hybrid 11 have a phase difference of 90°.

A signal of the output terminal 3 of the hybrid 11 is input to the input terminal 1 of the hybrid 13, and a signal that is input to the input terminal 1 of the hybrid 13 is divided into signals of two paths having the same amplitude and a phase difference of 90° by the hybrid 13 and is output to the two output terminals 3 and 4 of the hybrid 13.

Further, a signal of the output terminal 4 of the hybrid 11 is input to the input terminal 1 of the hybrid 14, and a signal that is input to the input terminal 1 of the hybrid 14 is divided to two signals having a phase difference of 90° by the hybrid 14 and is output to the two output terminals 3 and 4 of the hybrid 14.

Finally, signals of the two output terminals 3 and 4 of the hybrid 13 and signals of the two output terminals 3 and 4 of the hybrid 14 have the same amplitude, but have phases of 0°, 90°, 90°, and 180°, respectively.

The signals of the two output terminals 3 and 4 of the hybrids 13 and 14 are input to and amplified in the power amplifiers 31-34, respectively, and signals that are amplified by the power amplifiers 31-34 are input to the two input terminals 1 and 2, respectively, of the hybrids 21 and 22, which are four input terminals of the output hybrid network 20.

Because the signals that are input to the two input terminals 1 and 2 of the hybrid 21 have the same amplitude and phases of 0° and 90°, respectively, two signals that are input to the two input terminals 1 and 2 of the hybrid 21 have a phase difference of 90°.

The signals that are input to the input terminals 1 and 2 are divided into two signals having a phase difference of 90° by the hybrid 21. Therefore, because two signals being out of phase are output to the output terminal 3 of the hybrid 21, the two signals are combined and cancelled. Because two signals being in phase are output to the output terminal 4 of the hybrid 21, the signal of the output terminal 4 of the hybrid 21 becomes a signal in which two signals being in phase at 90° are combined, and the signal is again input to the input terminal 1 of the hybrid 24.

Similarly, because signals that are input to the two input terminals 1 and 2 of the hybrid 22 have the same amplitude and phases of 90° and 180°, respectively, the two signals that are input to the two input terminals 1 and 2 of the hybrid 22 also have a phase difference of 90°.

The signals that are input to the input terminals 1 and 2 are divided into two signals having a phase difference of 90° by the hybrid 21. Therefore, two signals being out of phase are output to the output terminal 3 of the hybrid 22 and thus the two signals are combined and cancelled. Because the two signals being in phase at 180° are output to the output terminal 4 of the hybrid 22, the signal of the output terminal 4 of the hybrid 22 becomes a signal in which two signals being in phase are combined, and the signal is again input to the input terminal 2 of the hybrid 24.

A signal in which two signals being in phase at 90° are combined is input to the input terminal 1 of the hybrid 24, and a signal in which two signals being in phase at 180° are combined is input to the input terminal 2 of the hybrid 24. Therefore, two signals being out of phase are output to the output terminal 3 of the hybrid 24 and thus the two signals are combined and cancelled. Because two signals being in phase at 180° are output to the output terminal 4 of the hybrid 24, a signal of the output terminal 4 of the hybrid 24 becomes a signal in which two signals being in phase at 180° are combined.

As a result, in the 4×4 multiport amplifiers, a signal that is input to the input terminal 1 of the hybrid 1 is output only to the output terminal 4 of the hybrid 24, and an input signal of the 4×4 multiport amplifiers and an output signal of the 4×4 multiport amplifiers have a phase difference of 180°.

The hybrids 11-14 and 21-24 may have an amplitude difference between output signals and may have an error in a phase. Further, in the power amplifiers 31-34, a phase of an output signal may have different values by non-linearity according to the amplitude of an input signal. In this way, when errors of amplitude and phase occur in the hybrids 11-14 and 21-24 and the power amplifiers 31-34 constituting the multiport amplifier, an in-phase or out-of-phase condition is not achieved in signals that are distributed in the input and output hybrid networks 10 and 20, as in an ideal operation, and thus an isolation performance of the input terminals I1-I4 and the output terminals O1-O4 of the multiport amplifier is deteriorated.

Figure 4:
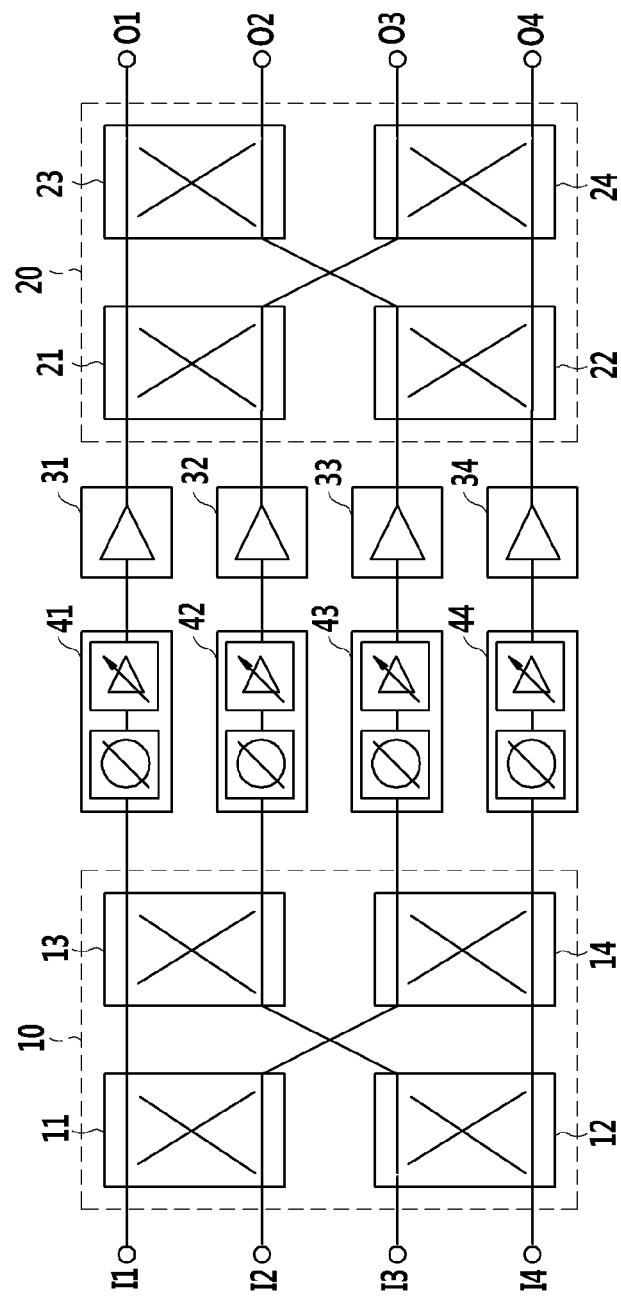
FIG. 4 is a diagram illustrating another example of a general multiport amplifier.

Therefore, as shown in FIG. 4, the multiport amplifier further includes amplitude and phase controllers 41-44 that control the amplitude and phase of a signal.

FIG. 4 is a diagram illustrating another example of a general multiport amplifier.

As shown in FIG. 4, the multiport amplifier further includes amplitude and phase controllers 41-44.

In order to prevent power loss of an output terminal of the multiport amplifier, the amplitude and phase controllers 41-44 are disposed at a front stage of the power amplifiers 31-34.

The amplitude and phase controllers 41-44 control the amplitude and phase of a signal that is output from the input hybrid network 10 so that amplitude and phase differences of a signal in the output hybrid network 20 of the multiport amplifier have the same values as those in an ideal multiport amplifier, thereby performing a function of improving isolation performance of the multiport amplifier. In this case, when embodying the multiport amplifier, values of the controlled phase and amplitude are determined as values that can embody optimum performance while including an actual performance of each constituent element.

However, an environment condition change such as performance degradation or a temperature change of a constituent element of the multiport amplifier may occur, and by such an environment condition change, the performance of constituent elements of the multiport amplifier may be changed. Therefore, the performance of the multiport amplifier cannot be maintained in an optimal state with values of a phase and a magnitude that are controlled in the amplitude and phase controllers 41-44. An exemplary embodiment that can maintain performance of the multiport amplifier in an optimal state even if an environment condition changes will be described hereinafter in detail with reference to FIG. 5.

Figure 5:
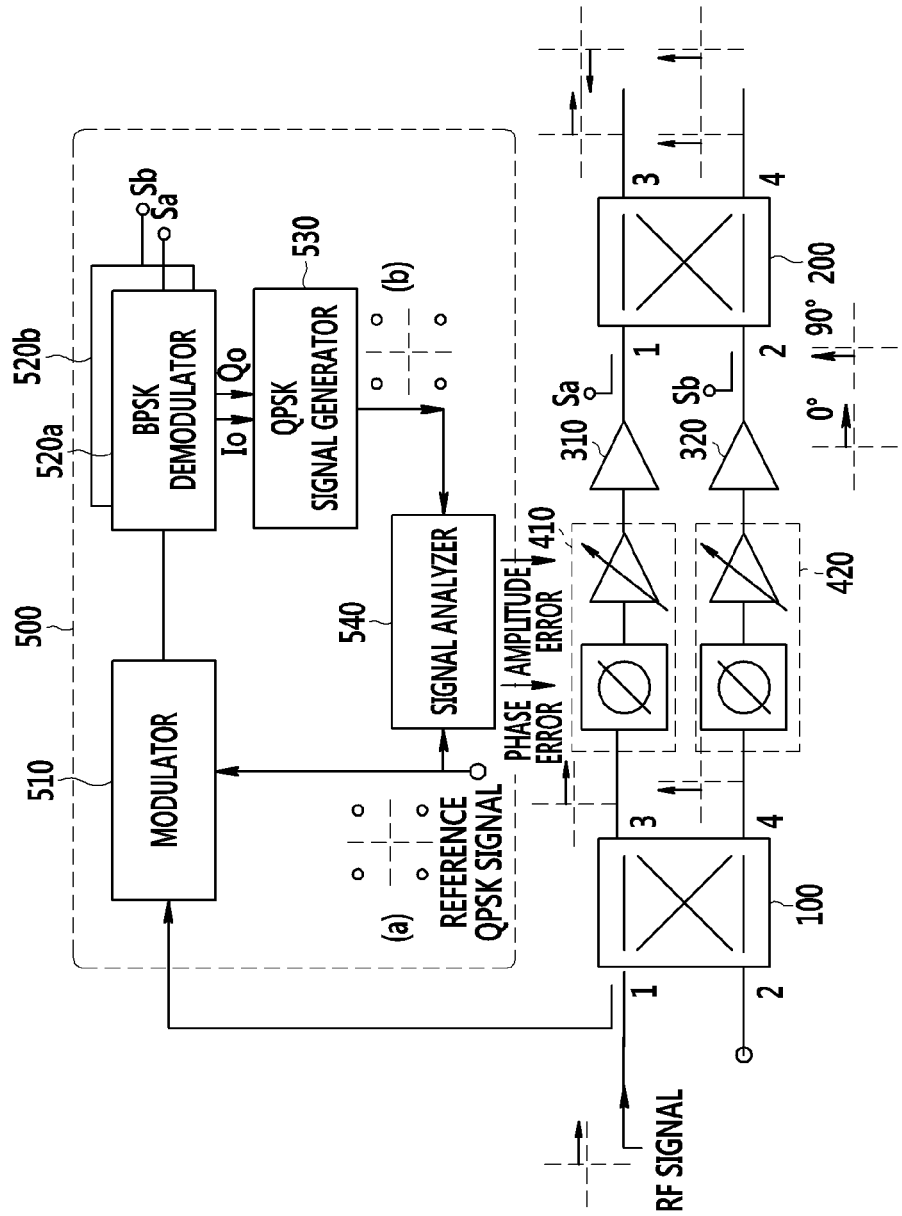
FIG. 5 is a diagram illustrating a multiport amplifier according to a first exemplary embodiment of the present invention.
Figure 6:
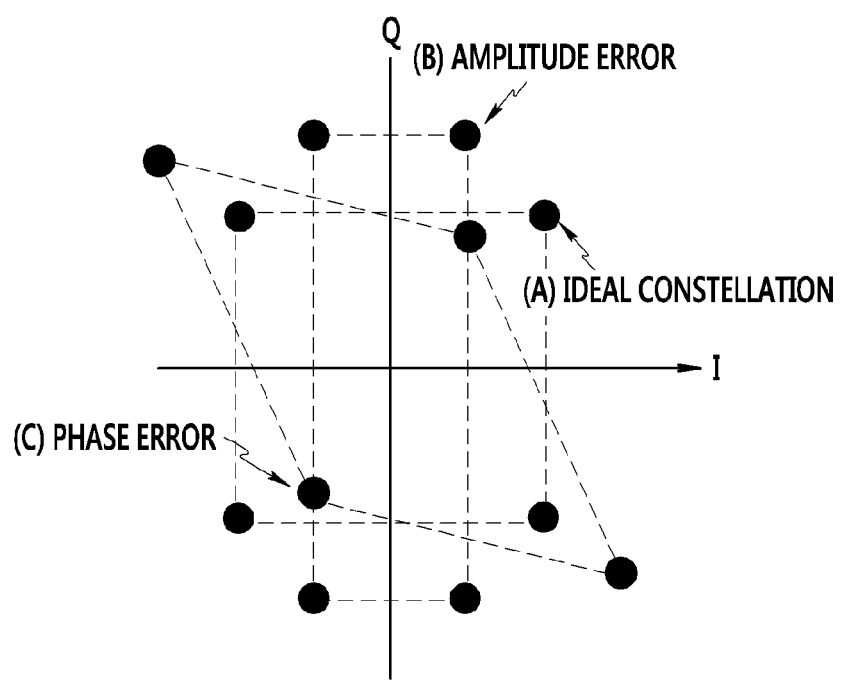
FIG. 6 is a diagram illustrating an example of a signal constellation of a BPSK demodulator according to amplitude and phase errors of the multiport amplifier that is shown in FIG. 5.

FIG. 5 is a diagram illustrating a multiport amplifier according to a first exemplary embodiment of the present invention, and FIG. 6 is a diagram illustrating an example of a signal constellation of a BPSK demodulator according to amplitude and phase errors of the multiport amplifier that is shown in FIG. 5.

For convenience of description, FIG. 5 illustrates 2×2 multiport amplifiers, and unlike the 4×4 multiport amplifiers, in the 2×2 multiport amplifiers of FIG. 5, an input hybrid network includes one input hybrid 100, and an output hybrid network includes one output hybrid 200. Accordingly, the 2×2 multiport amplifiers include two power amplifiers 310 and 320 and two amplitude and phase controllers 410 and 420.

Further, even if an environment condition changes, in order to maintain performance of a multiport amplifier in an optimal state, the 2×2 multiport amplifiers according to an exemplary embodiment of the present invention further includes an error calibration unit 500.

The error calibration unit 500 detects amplitude and phase errors of multiple signals of the multiport amplifier. The amplitude and phase controllers 410 and 420 control amplitude and phase according to amplitude and phase errors of a corresponding signal. The error calibration unit 500 and the amplitude and phase controllers 410 and 420 are referred to as an amplitude and phase error calibration apparatus of the multiport amplifier.

The input hybrid 100, the output hybrid 200, the two power amplifiers 310 and 320, and the two magnitude and phase controllers 410 and 420 have the same functions as those of the hybrids 11-14 and 21-24, the power amplifiers 31-34, and the magnitude and phase controllers 41-44 that are described with reference to FIGS. 1 to 4, and therefore a detailed description thereof will be omitted.

The error calibration unit 500 includes a modulator 510, two BPSK demodulators 520a and 520b corresponding to the number of input terminals of the output hybrid 200, a QPSK signal generator 530, and a signal analyzer 540.

The modulator 510 modulates a reference QPSK signal of a baseband to an RF signal by an RF signal that is input to one input terminal 1 of the input hybrid 100, and outputs a reference QPSK signal that is modulated to the RF signal to the BPSK demodulators 520a and 520b. In this case, the reference QPSK signal may have a constellation of (a) of FIG. 5.

Further, RF signals Sa and Sb that are input to two input terminals 1 and 2 of the output hybrid 200 are input to the BPSK demodulators 520a and 520b. In this case, the RF signal Sa that is input to the input terminal 1 of the output hybrid 200 has a phase of 0°, and the RF signal Sb that is input to the input terminal 2 of the output hybrid 200 has a phase of 90°.

The BPSK demodulator 520a demodulates (downward converts) a QPSK signal that is modulated to an RF signal by the modulator 510 to an I signal Io of a baseband by an RF signal Sa that is input to the input terminal 1 of the output hybrid 200, and the BPSK demodulator 520b demodulates a QPSK signal that is modulated to an RF signal by the modulator 510 to a Q signal Qo of a baseband by an RF signal Sb that is input to an input terminal 2 of the output hybrid 200. In this case, it is assumed that phase and amplitude changes generated in the two BPSK demodulators 520a and 520b are the same. Further, the RF signals Sa and Sb may be continuous wave (CW) signals.

The QPSK signal generator 530 couples a pair of I and Q signals Io and Qo of a baseband that are demodulated by the BPSK demodulators 520a and 520b, generates a QPSK signal of one baseband, and outputs the generated QPSK signal to the signal analyzer 540. That is, because an I signal and a Q signal of a baseband that are demodulated by the BPSK demodulators 520a and 520b correspond to BPSK signals, when the I signal and the Q signal are combined, a QPSK signal of one baseband is generated, as shown in (b) of FIG. 5.

The signal analyzer 540 compares a reference QPSK signal and a QPSK signal that is generated by the QPSK signal generator 530, and detects amplitude and phase errors.

It is assumed that a constellation of a reference QPSK signal is shown in (a) of FIG. 5. In an ideal multiport amplifier, a constellation of a QPSK signal that is demodulated by the BPSK demodulators 520a and 520b is the same as a constellation that is shown in (a) of FIG. 5, as shown in (a) of FIG. 6. However, when an amplitude error occurs in the multiport amplifier according to an environment change, a constellation of a QPSK signal that is generated by the QPSK signal generator 530 and the BPSK demodulators 520a and 520b is as shown in (b) of FIG. 6. Further, when a phase error occurs in the multiport amplifier, a constellation of a QPSK signal that is generated by the QPSK signal generator 530 and the BPSK demodulators 520a and 520b is as shown in (c) of FIG. 6. Therefore, the signal analyzer 540 compares a reference QPSK signal and a QPSK signal that is generated by the QPSK signal generator 530 and the BPSK demodulators 520a and 520b, and detects amplitude and phase errors of the multiport amplifier.

The signal analyzer 540 outputs the detected amplitude and phase errors to the magnitude and phase controllers 410 and 420.

The magnitude and phase controllers 410 and 420 each control an amplitude and a phase of an input RF signal according to amplitude and phase errors that are detected by the signal analyzer 540.

Figure 7:
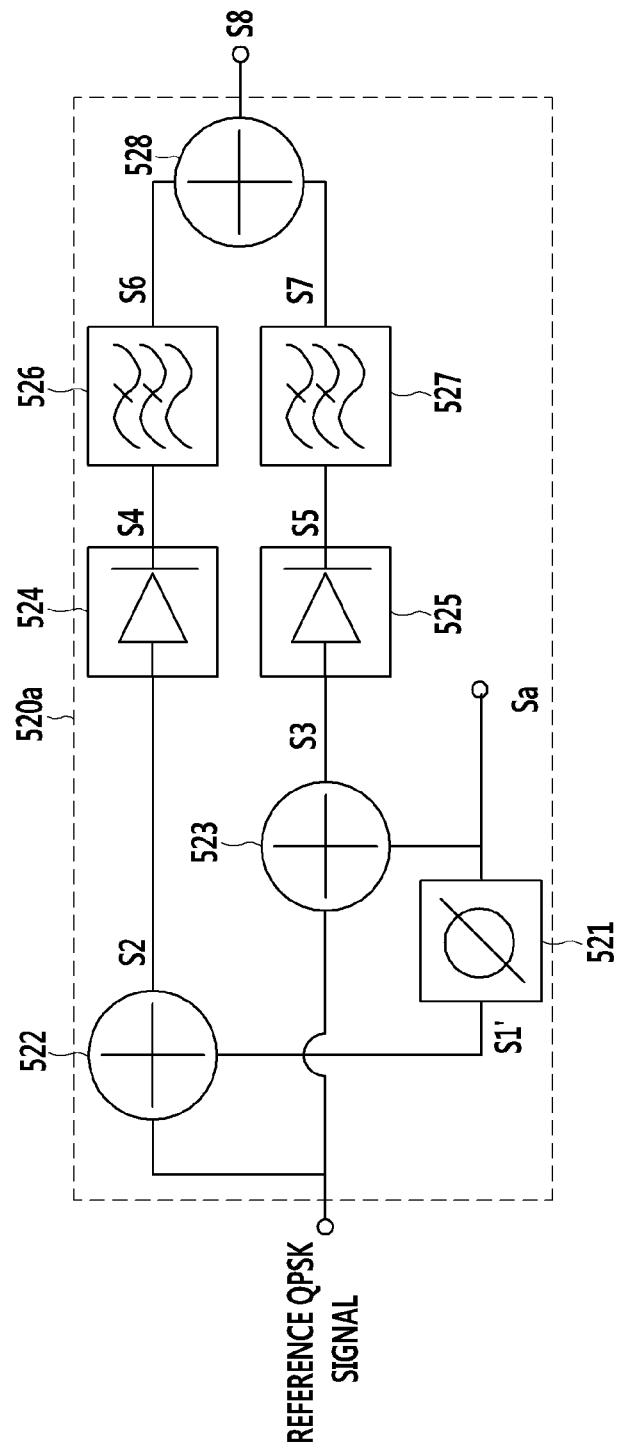
FIG. 7 is a diagram illustrating a detailed configuration of a BPSK demodulator that is shown in FIG. 5.
Figure 8:
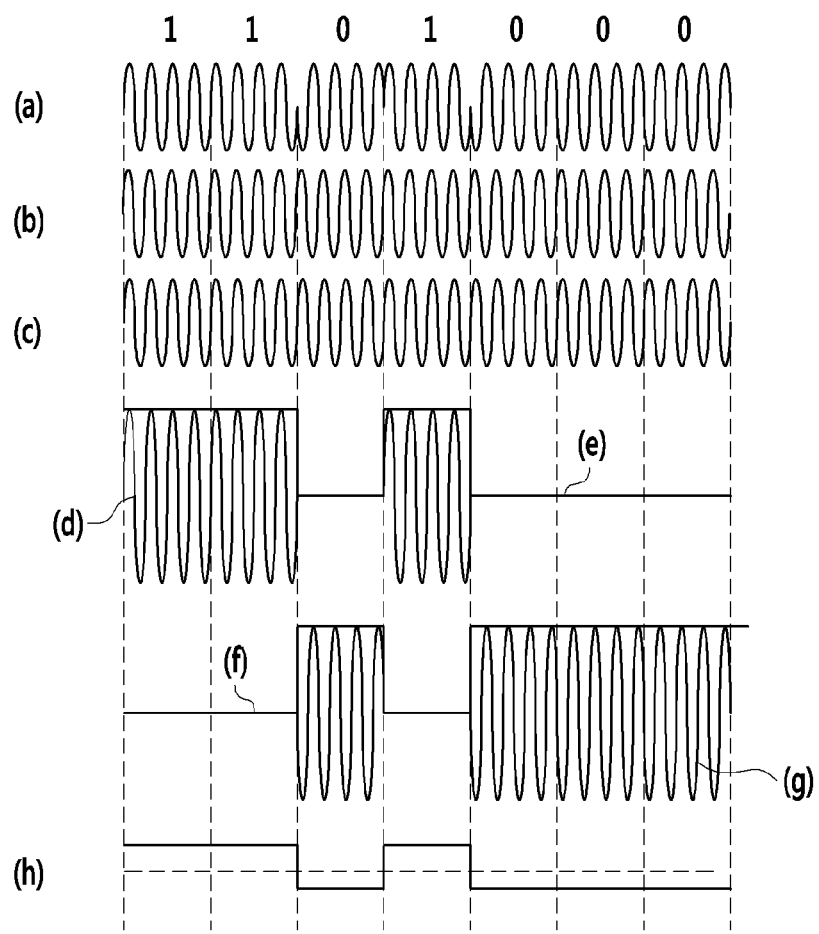
FIG. 8 is a diagram illustrating an example of a signal waveform of a detailed configuration of a BPSK demodulator that is shown in FIG. 7.

FIG. 7 is a diagram illustrating a detailed configuration of a BPSK demodulator that is shown in FIG. 5, and FIG. 8 is a diagram illustrating an example of a signal waveform of a detailed configuration of a BPSK demodulator that is shown in FIG. 7.

FIG. 7 illustrates only a BPSK demodulator 520a of the BPSK demodulators 520a and 520b.

Referring to FIG. 7, the BPSK demodulator 520a includes a phase converter 521, RF couplers 522 and 523, power detectors 524 and 525, low pass filters 526 and 527, and an analog decoder 528.

The phase converter 521 converts a phase of an RF signal (Sa) that is input to the input terminal 1 of the output hybrid 200 by 180° and outputs an RF signal S1 having a phase that is converted by 180° to the RF coupler 522.

The RF coupler 522 adds (couples) an RF signal S1 having a phase that is converted by 180° by the phase converter 521 and a reference QPSK signal that is modulated to an RF signal and outputs the added (coupled) signal to the power detector 524.

The RF coupler 523 adds the RF signal S1 and a reference QPSK signal that is modulated to an RF signal and outputs the added signal to the power detector 525.

The power detectors 524 and 525 detect only signals S4 and S5 of a baseband from output signals S2 and S3 of the RF couplers 522 and 523, and output the signals S4 and S5 to the low pass filters 526 and 527, respectively.

The low pass filters 526 and 527 select and pass through a predetermined frequency band of frequency from the signals S4 and S5 of a baseband that are detected from the power detectors 524 and 525, respectively.

The analog decoder 528 subtracts and outputs signals S6 and S7 of a baseband that pass through the low pass filters 526 and 527. An output signal S8 of the analog decoder 528 becomes an I signal of a baseband.

When a reference QPSK signal that is modulated to an RF signal is defined as Vmod, Vmod may be represented by Equation 1.

$$v_{mod}=A_{mod}\cos(\omega_{mod}t+\phi_{mod}) \quad \text{[Equation 1]}$$

When the reference QPSK signal that is modulated to an RF signal and the RF signal Sa that is input to the input terminal 1 of the output hybrid 200 are input to the BPSK demodulator 520a, the output signals S6 and S7 of the low pass filters 526 and 527 may be represented by Equation 2 and Equation 3, respectively.

$$P_1 = L[\{A_{mod}\cos(\omega_{mod}t + \varphi_{mod}) + A_{CW}\cos(\omega_{CW}t)\}^2] = \quad \text{[Equation 2]}$$
$$\frac{1}{2}(A_{mod}^2 + A_{CW}^2) + A_{mod}A_{CW}\cos(\varphi_{mod})$$

$$P_2 = L[\{A_{mod}\cos(\omega_{mod}t + \varphi_{mod}) - A_{CW}\cos(\omega_{CW}t)\}^2] = \quad \text{[Equation 3]}$$
$$\frac{1}{2}(A_{mod}^2 + A_{CW}^2) - A_{mod}A_{CW}\cos(\varphi_{mod})$$

Here, P1 is an output signal S6 of the low pass filter 526, and P2 is an output signal S7 of the low pass filter 527. $A_{CW}\cos(\omega_{CW}t)$ corresponds to an RF signal S1 that is input to the input terminal 1 of the output hybrid 200.

The output signals S6 and S7 of the low pass filters 526 and 527 are processed in the analog decoder 528 and become an I signal of a baseband of Equation 4.

$$y(t)=2A_{mod}A_{CW}\cos(\phi_{mod}) \quad \text{[Equation 4]}$$

Here, y(t) is an output signal of the analog decoder 528 and represents an I signal of a baseband.

For example, it is assumed that a reference QPSK signal that is modulated to an RF signal is as shown in (a) of FIG. 8 and an RF signal Sa that is input to the input terminal 1 of the output hybrid 200 is as shown in (b) of FIG. 8. In this case, an RF signal S1 having a phase that is converted by 180° by the phase converter 521 is as shown in (c) of FIG. 8. Therefore, the output signal S2 of the RF coupler 522 is shown as in (d) of FIG. 8, and the output signal S6 of the low pass filter 526 is as shown in (e) of FIG. 8. Further, the output signal S3 of the RF coupler 523 is as shown in (f) of FIG. 8, and the output signal S7 of the low pass filter 527 is as shown in (g) of FIG. 8. Therefore, an output signal S8 of the analog decoder 528 becomes a BPSK signal that is as shown in (h) of FIG. 8, i.e., an I signal of a baseband.

That is, when a phase difference between a reference QPSK signal that is modulated to an RF signal and an RF signal S1 is 0°, the BPSK demodulator 520a generates a BPSK signal of (h) of FIG. 8 using the reference QPSK signal that is modulated to an RF signal and the RF signal Sa.

The remaining BPSK demodulator 520b is also formed similarly to the BPSK demodulator 520a. In this case, the reference QPSK signal that is modulated to an RF signal and the RF signal Sb that is input to the input terminal 2 of the output hybrid 200 are input to the BPSK demodulator 520b, and the RF signal Sb has a phase of 90°. Therefore, a signal of a base band Q is output to the BPSK demodulator 520b, as shown in Equation 5.

$$y(t)=2A_{mod}A_{CW}\sin(\phi_{mod}) \quad \text{[Equation 5]}$$

Here, y(t) represents a Q signal of a baseband.

An I signal of a baseband of Equation 4 and a Q signal of a baseband of Equation 5 are coupled by the QPSK signal generator 530 to generate one QPSK signal. Therefore, the signal analyzer 540 detects an I or Q signal of the QPSK signal according to an input phase and compares a reference QPSK signal and a QPSK signal that is generated by the QPSK signal generator 530, thereby distinguishing and detecting amplitude and phase errors.

When amplitude and phase errors are detected by the signal analyzer 540, the amplitude and phase controllers 410 and 420 control a phase and an amplitude of an input RF signal according to the amplitude and phase errors.

The amplitude and phase controllers 410 and 420 calibrate phase and amplitude errors while not being influenced by a delay effect according to each signal path with a method of minimizing a relative phase error and a relative amplitude error of two signals S1 and S2.

That is, when an amplitude error and a phase error are detected, the amplitude and phase controller 420 calibrates an amplitude and a phase of the input RF signal according to an amplitude error and a phase error based on an amplitude and a phase of an RF signal that is input to the amplitude and phase controller 410. In this way, because a relative amplitude and a relative phase of two signal paths are compared and calibrated, a phase calibration procedure according to a signal path can be reduced.

Known technology of an error calibration unit of the multiport amplifier includes a method of using a superheterodyne transmitter based on a multiplicative mixing method. The known method is a method of calibrating a phase or an amplitude by detecting a signal magnitude of an output terminal in which a signal is not output, i.e., a null point, among output terminals of an output hybrid, and is a method of minimizing a signal magnitude of the detected null point. In the known method, it cannot be known whether a phase error or an amplitude error occurs in a multiple signal path. Therefore, in the known method, a calibration time of a phase or an amplitude is extended, and phase and amplitude error ranges may be decreased according to a signal magnitude of the detected null point.

Further, because the known method uses a multiplicative mixing method, an intermediate frequency IF is necessary, and because hardware that embodies the intermediate frequency should be added, the size, weight, and power consumption of an apparatus increase, compared with an additive mixing method of the BPSK demodulators 520a and 520b according to an exemplary embodiment of the present invention.

That is, because the error calibration unit 500 according to an exemplary embodiment of the present invention uses a direct conversion method based on an additive mixing method, the size, weight, and power consumption of a circuit can be reduced, compared with a superheterodyne method based on a known multiplicative mixing method, and a phase error and an amplitude error can be distinguished and detected.

Figure 9:
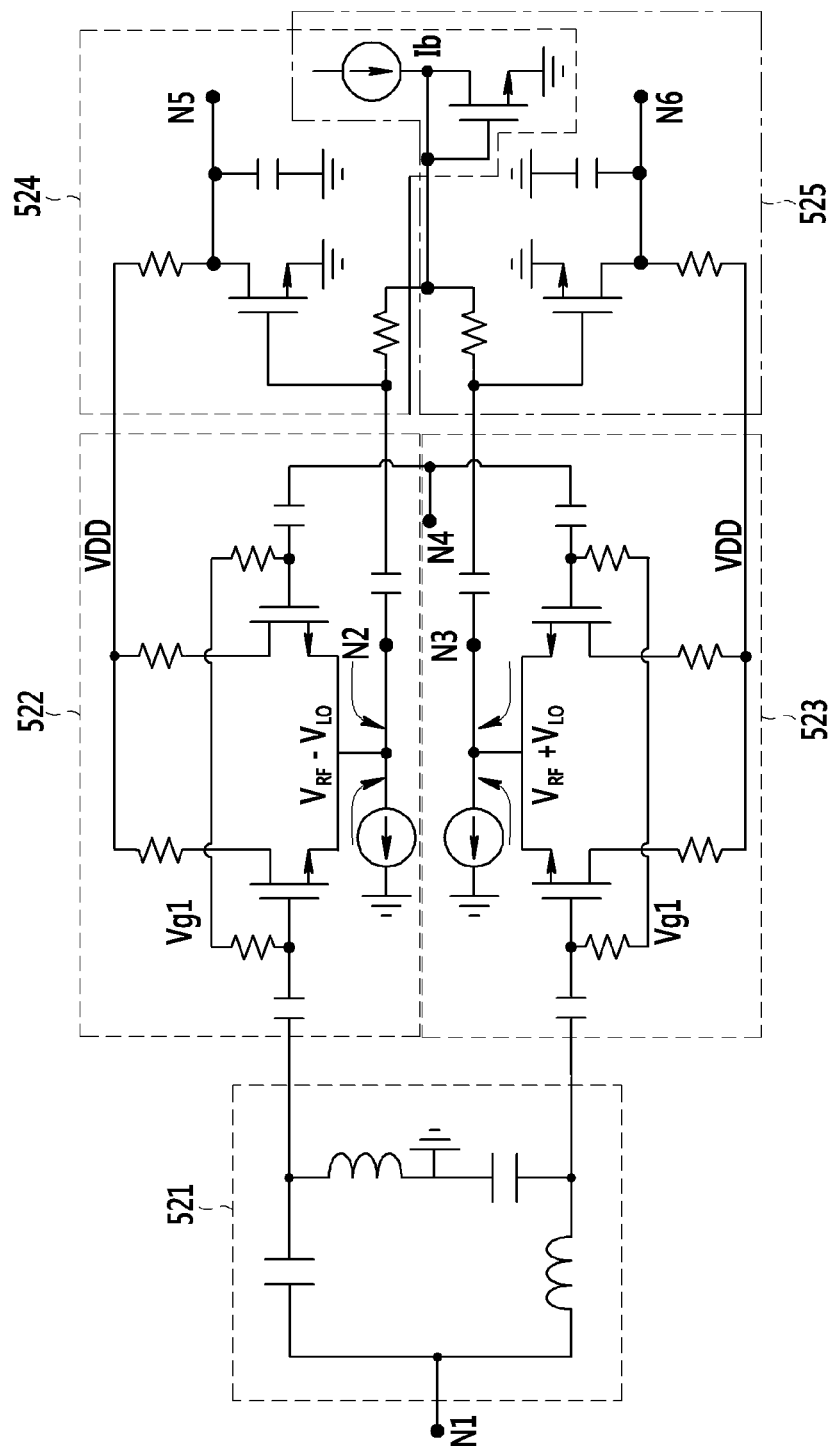
FIG. 9 is a diagram illustrating an example of a detailed circuit configuration of a phase converter, two RF couplers, and two power detectors that are shown in FIG. 7.

FIG. 9 is a diagram illustrating an example of a detailed circuit configuration of a phase converter, two RF couplers, and two power detectors that are shown in FIG. 7.

As shown in FIG. 9, the phase converter 521 is formed using a balun circuit that converts an RF signal of a single phase that is input to a node N1 to a differential phase. In this case, an RF signal Sa is input to the node N1 of the phase converter 521. In FIG. 9, a balun circuit is formed using a passive element such as an inductor and a capacitor.

Further, the RF couplers 522 and 523 and the power detectors 524 and 525 may each be formed using an active element such as a transistor and a passive element such as a capacitor or a resistor, a QPSK signal that is modulated to an RF signal is input to a node N4, and signals of nodes N2 and N3 become an output signal of the RF couplers 522 and 523, while signals of nodes N5 and N6 become an output signal of the power detectors 524 and 525.

In this way, because the BPSK demodulators 520a and 520b may be formed using an active element such as a transistor and a passive element such as an inductor, a resistor, and a capacitor, there is a merit that the BPSK demodulators 520a and 520b may have a light weight and a small size.

Further, the BPSK demodulators 520a and 520b may be formed using a ring hybrid and a diode detector.

It is known technology to embody the phase converter 521, the RF couplers 522 and 523, and the power detectors 524 and 525 using a passive element or an active element and therefore a detailed description thereof will be omitted.

Figure 10:
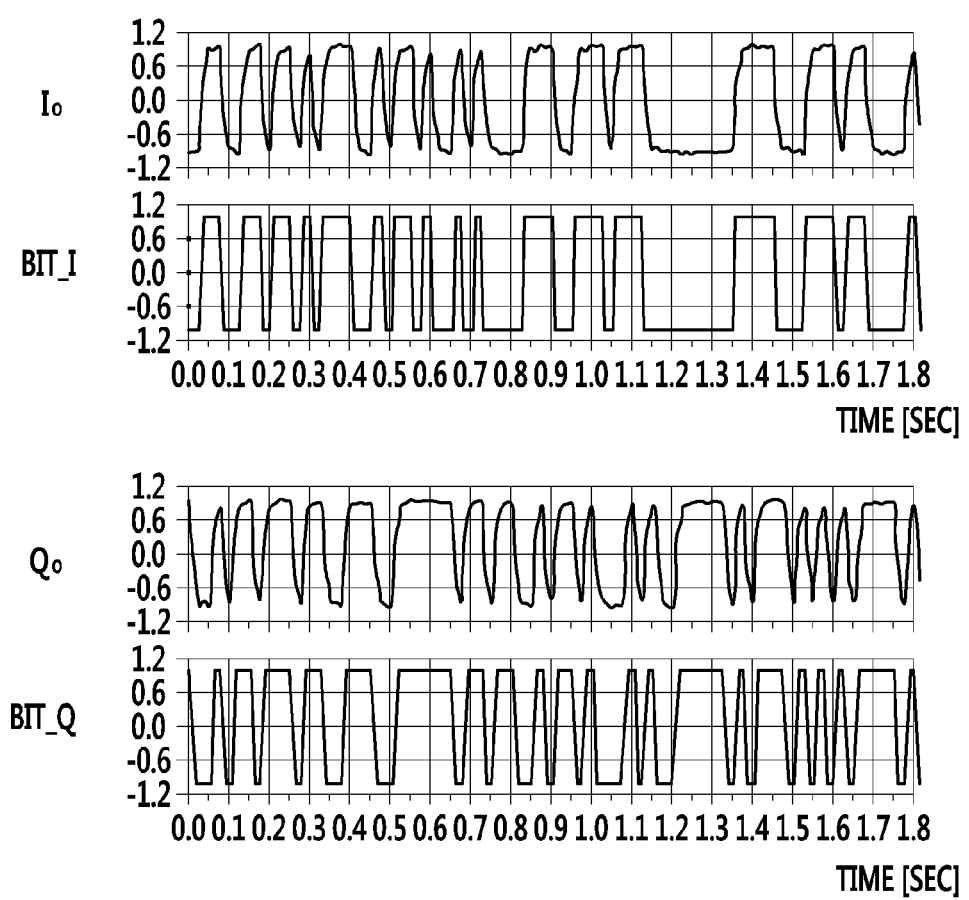
FIG. 10 is a graph illustrating a reference QPSK signal and a QPSK signal that are generated by two BPSK demodulators through a simulation result when amplitude and phase errors do not occur in a multiport amplifier according to an exemplary embodiment of the present invention.

FIG. 10 is a graph illustrating a reference QPSK signal and a QPSK signal that is generated by two BPSK demodulators through a simulation result when amplitude and phase errors do not occur in a multiport amplifier according to an exemplary embodiment of the present invention.

In FIG. 10, Io is an I signal (BPSK signal) that is demodulated by the BPSK demodulator 520a, and Qo is a Q signal (BPSK signal) that is demodulated by the BPSK demodulator 520b. Further, BIT_I and BIT_Q represent an I signal and a Q signal, respectively, when a reference QPSK signal is separated to a BPSK signal.

As shown in FIG. 10, when phase and amplitude errors do not occur in the multiport amplifier, a reference QPSK signal and a QPSK signal that is generated by the QPSK signal generator 530 and two BPSK demodulators 520a and 520b are very similar.

However, when phase and amplitude errors occur in the multiport amplifier, a constellation of a QPSK signal that is generated by the BPSK demodulators 520a and 520b is changed to another form instead of a square, as shown in FIG. 6. When an amplitude error occurs, the amplitude error is represented in a quadrangle form in which a width and a length are different, and when a phase error occurs, the amplitude error is represented in a quadrangle form in which lengths of a diagonal are different.

The amplitude and phase controllers 410 and 420 calibrate amplitude and phase errors according to a degree in which a constellation of a QPSK signal that is generated by the BPSK demodulators 520a and 520b is changed to correspond to a reference QPSK signal. Thereby, even if a change occurs in performance of constituent elements of the multiport amplifier by an environment condition change, amplitude and phase errors of an input RF signal can be successfully calibrated and thus performance of the multiport amplifier can be maintained in an optimal state.

Figure 11:
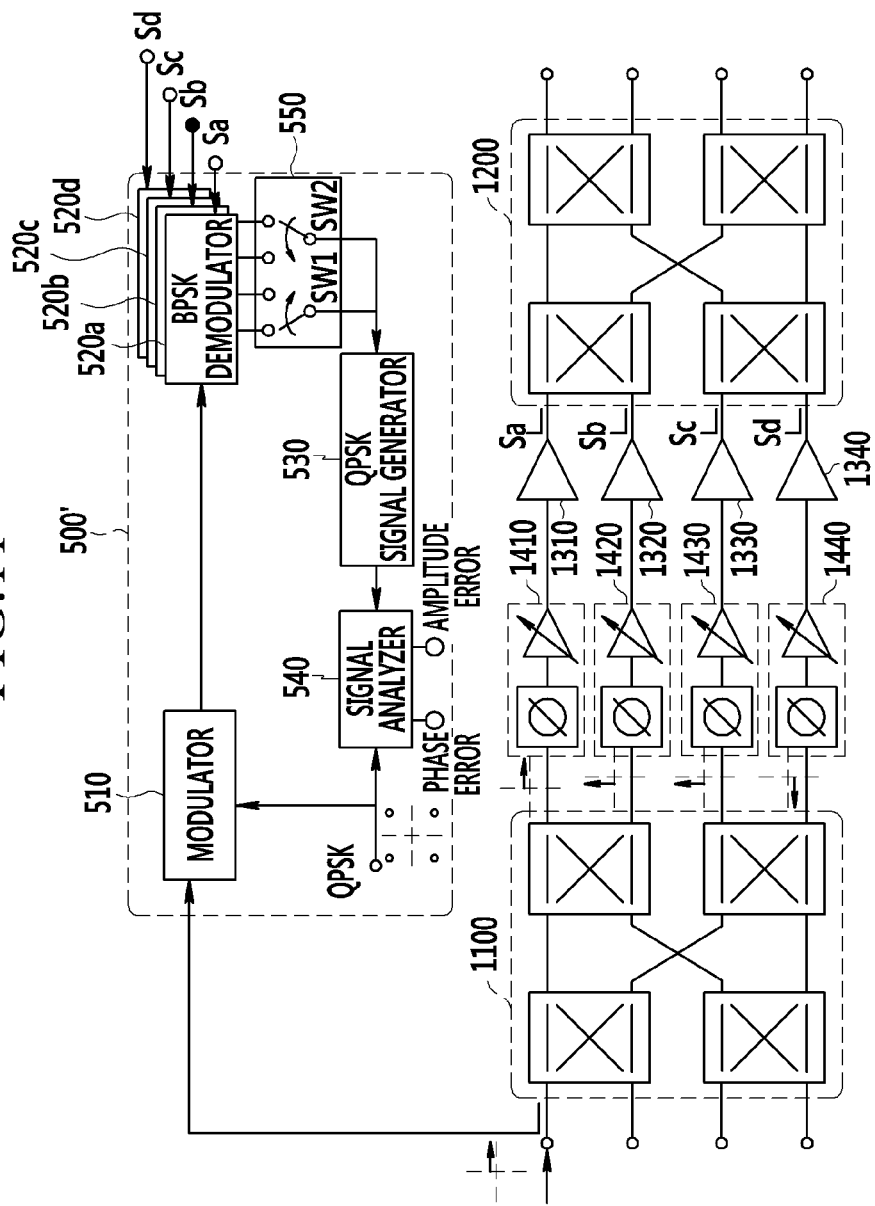
FIG. 11 is a diagram illustrating a multiport amplifier according to a second exemplary embodiment of the present invention.

FIG. 11 is a diagram illustrating a multiport amplifier according to a second exemplary embodiment of the present invention.

FIG. 11 illustrates 4×4 multiport amplifiers, unlike FIG. 5.

Referring to FIG. 11, the 4×4 multiport amplifiers have the same structure and function as those of FIG. 4, except for an error calibration unit 500'.

That is, an input hybrid network 1100, an output hybrid network 1200, four power amplifiers 1310, 1320, 1330, and 1340, and four amplitude and phase controllers 1410, 1420, 1430, and 1440 of the 4×4 multiport amplifiers have the same functions as those of the input hybrid network 10, the output hybrid network 20, the power amplifiers 31-34, and the magnitude and phase controllers 41-44 that are described with reference to FIGS. 1 to 4, and therefore a detailed description thereof will be omitted.

Unlike 2×2 multiport amplifiers including one input hybrid 100 and one output hybrid 200, the error calibration unit 500' of the 4×4 multiport amplifiers further includes a signal selector 550.

The signal selector 550 includes two switches SW1 and SW2, and controls switching of the switches SW1 and SW2.

The switch SW1 is switched by the control of the signal selector 550 to selectively output one of output signals of BPSK demodulators 520*a* and 520*d* to the QPSK signal generator 530, and the switch SW1 is switched by the control of the signal selector 550 to selectively output one of output signals of BPSK demodulator 520*b* and 520*c* to the QPSK signal generator 530. In this case, the signal selector 550 controls switching of the switches SW1 and SW2 so that an I signal and a Q signal of a baseband may be coupled to generate one QPSK signal.

For example, when an RF signal having a phase of 0° is input to the input hybrid network 1100, each of RF signals of 0°, 90°, 90, and 180° is ideally input to the output hybrid network 1200, and the RF signals of 0°, 90°, 90, and 180° are input to the BPSK demodulators 520*a*-520*d*, respectively.

First, in order to calibrate an amplitude and a phase of a signal Sb based on a signal Sa, the switch SW1 is connected to the BPSK demodulator 520*a* by the control of the signal selector 550, and the switch SW2 is connected to the BPSK demodulator 520*b* by the control of the signal selector 550. The QPSK signal generator 530 generates one QPSK signal by coupling an I signal of a baseband that is demodulated by the BPSK demodulator 520*a* and an Q signal of a baseband that is demodulated by the BPSK demodulator 520*b*. Therefore, the signal analyzer 540 compares a reference QPSK signal and one QPSK signal that is generated by the BPSK demodulators 520*a* and 520*b* and detects amplitude and phase errors, and the amplitude and phase controller 1420 controls a magnitude and a phase of an input RF signal according to the detected amplitude and phase errors.

Next, in order to calibrate an amplitude and a phase of a signal Sc based on a signal Sa, the switch SW1 is connected to the BPSK demodulator 520*a* by the control of the signal selector 550, and the switch SW2 is connected to the BPSK demodulator 520*c* by the control of the signal selector 550. The QPSK signal generator 530 generates one QPSK signal by coupling an I signal of a baseband that is demodulated by the BPSK demodulator 520*a* and a Q signal of a baseband that is demodulated by the BPSK demodulator 520*c*. Therefore, the signal analyzer 540 compares a reference QPSK signal and one QPSK signal that is generated by the BPSK demodulators 520*a* and 520*c* and detects amplitude and phase errors, and the amplitude and phase controller 1430 controls a magnitude and a phase of an input RF signal according to the detected amplitude and phase errors.

Finally, in order to calibrate an amplitude and a phase of a signal Sd based on the signal Sb or Sc, the switch SW1 is connected to a BPSK demodulator 520*d* by the control of the signal selector 550, and the switch SW2 is connected to the BPSK demodulator 520*b* or 520*c* by the control of the signal selector 550. When it is assumed that the switch SW2 is connected to the BPSK demodulator 520*b*, the QPSK signal generator 530 generates one QPSK signal by coupling an I signal of a baseband that is demodulated by the BPSK demodulator 520*d* and a Q signal of a baseband that is demodulated by the BPSK demodulator 520*b*. Therefore, the signal analyzer 540 compares a reference QPSK signal and one QPSK signal that is generated by the BPSK demodulators 520*d* and 520*b* and detects amplitude and phase errors, and the amplitude and phase controller 1440 controls a magnitude and a phase of an input RF signal according to the detected amplitude and phase errors.

In this way, the error calibration unit 500' relatively detects amplitude and phase errors of each of multiple signals and thus amplitudes and phases of each signal are compensated.

Figure 12:
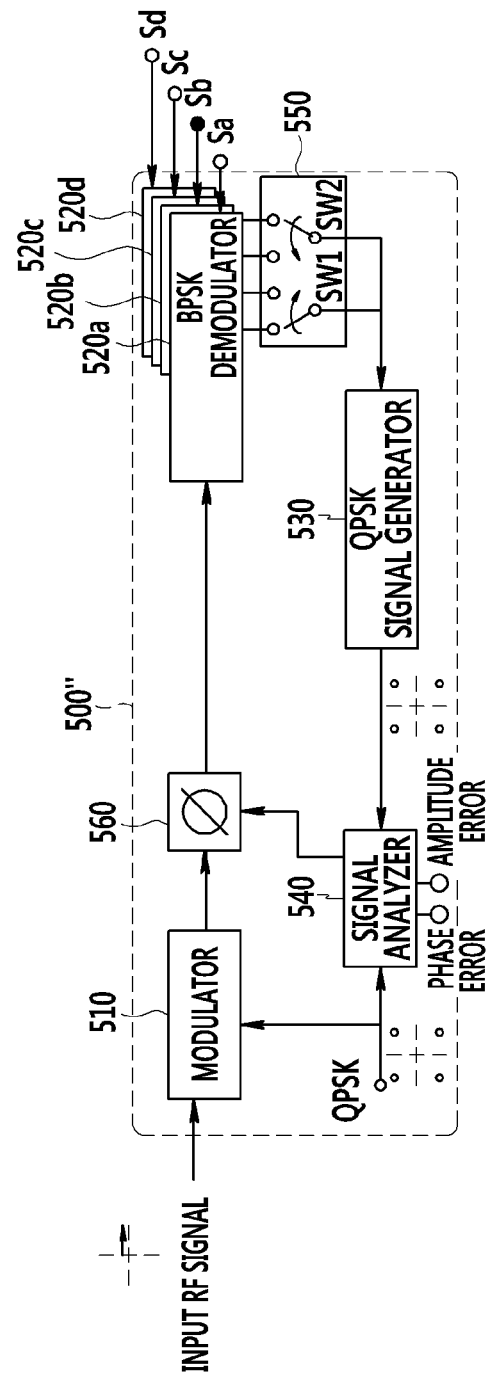
FIG. 12 is a diagram illustrating a multiport amplifier according to a third exemplary embodiment of the present invention.
Figure 13:
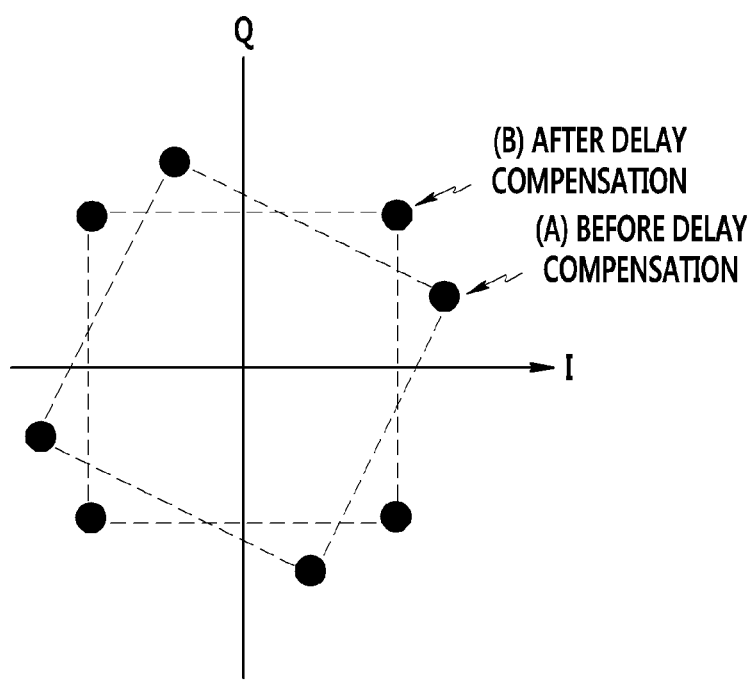
FIG. 13 is a diagram illustrating a signal constellation by delay that may occur in modulation of a modulator and demodulation of a BPSK demodulator.

FIG. 12 is a diagram illustrating a multiport amplifier according to a third exemplary embodiment of the present invention, and FIG. 13 is a diagram illustrating a signal constellation by delay that may occur in modulation of a modulator and demodulation of a BPSK demodulator.

Referring to FIG. 12, an error calibration unit 500" further includes a phase converter 560.

As shown in FIG. 13, a delay may occur in a modulation process of a modulator 510 and a demodulation process of BPSK demodulators 520*a*-520*d* by a transmission path between the modulator 510 and the BPSK demodulators 520*a*-520*d*. By a delay occurring in a transmission process between the modulator 510 and the BPSK demodulators 520*a*-520*d*, a phase of a QPSK signal that is generated by the QPSK signal generator 530 may be changed within 360°, as shown in (a) of FIG. 13.

A signal analyzer 540 analyzes a phase of the QPSK signal that is generated by the QPSK signal generator 530, detects a phase change amount by delay, and outputs the detected phase change amount to the phase converter 560.

The phase converter 560 changes a phase of a reference QPSK signal that is modulated to an RF signal according to a phase change amount by delay and outputs the phase to the BPSK demodulators 520*a*-520*d*. Therefore, as shown in (a) of FIG. 13, a phase of the QPSK signal that is changed by delay is normally compensated, as shown in (b) of FIG. 13.

According to an exemplary embodiment of the present invention, a multiport amplifier having an error calibration function that can auto-calibrate phase and amplitude errors of a multiport amplifier due to an environment condition change such as degradation of a component performance or a temperature change can be embodied.

Further, a multiport amplifier including a small error calibration apparatus of low power can be embodied, and it can be distinguished whether an error occurring when manufacturing the multiport amplifier is a phase error or an amplitude error.

An exemplary embodiment of the present invention may not only be embodied through the above-described apparatus and/or method, but may also be embodied through a program that executes a function corresponding to a configuration of the exemplary embodiment of the present invention or through a recording medium on which the program is recorded, and can be easily embodied by a person of ordinary skill in the art from a description of the foregoing exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A multiport amplifier comprising:
an input hybrid network that generates a plurality of RF signals using an input RF signal;
a plurality of power amplifiers that amplify and output the plurality of RF signals, respectively;

an output hybrid network that generates at least one output RF signal from output signals of the plurality of power amplifiers;

an error detector that generates at least one quadrature phase shift keying (QPSK) signal using the input RF signal and the output signals of the plurality of power amplifiers, and that detects an amplitude error and a phase error of the output signals of the plurality of power amplifiers by comparing the at least one QPSK signal and the reference QPSK signal; and a plurality of amplitude and phase controllers that control amplitudes and phases of plurality of RF signals according to the amplitude error and the phase error.

2. The multiport amplifier of claim 1, wherein the error detector comprises:

a modulator that modulates the reference QPSK signal to an RF signal by the input RF signal;

a plurality of BPSK demodulators that demodulate a reference QPSK signal that is modulated to the RF signal to an I signal or a Q signal using each of output signals of the plurality of power amplifiers; and a QPSK signal generator that generates the at least one QPSK signal by coupling a pair of an I signal and a Q signal of an I signal or a Q signal of the plurality of BPSK demodulators.

3. The multiport amplifier of claim 2, wherein the error detector further comprises a signal analyzer that detects an amplitude error and a phase error by comparing the reference QPSK signal and the one generated QPSK signal, wherein an amplitude and phase controller that is related to the one generated QPSK signal among the plurality of amplitude and phase controllers controls amplitude and phase of a corresponding RF signal according to the detected amplitude error and phase error.

4. The multiport amplifier of claim 2, wherein the error detector further comprises a phase converter that changes a phase of the reference QPSK signal that is modulated to the RF signal based on phase delay of the at least one QPSK signal.

5. The multiport amplifier of claim 2, wherein the error detector further comprises a signal selector that select output signals of two BPSK demodulators that receive output signals of two power amplifiers having a phase difference of 90° among the plurality of BPSK demodulators and that output the selected output signals to the QPSK signal generator.

6. The multiport amplifier of claim 2, wherein the plurality of BPSK demodulators each comprise:

a phase converter that converts a phase of the output signal of the input power amplifier by 180°;

a first RF coupler that adds and outputs a signal having a phase that is converted by 180° and a reference QPSK signal that is modulated to the RF signal;

a second RF coupler that adds and outputs the output signal of the input power amplifier and a reference QPSK signal that is modulated to the RF signal;

first and second low pass filters that detect only a signal of a baseband from the output signal of the first and second RF couplers; and an analog decoder that generates an I signal or a Q signal of a baseband from a difference between signals of the baseband that are detected from each of the first and second low pass filters.

7. The multiport amplifier of claim 1, wherein the input hybrid network comprises a plurality of first hybrids that distribute and output the input RF signal to a plurality of RF signals having the same amplitude and phase difference, and the output hybrid network comprises a plurality of second hybrids that generate at least one output RF signal by distributing output signals of the plurality of power amplifiers to a plurality of RF signals having the same amplitude and phase difference.

8. A method of amplifying a multiport amplifier, the method comprising:

dividing an input RF signal to a first plurality of RF signals having the same amplitude and phase difference;

amplifying each of the first plurality of RF signals;

generating at least one output RF signal by distributing dividing each of the amplified plurality of RF signals to a second plurality of RF signals having the same magnitude and phase difference; and controlling amplitudes and phases of the first plurality of RF signals using at least one QPSK signal that is generated from a reference QPSK signal and the amplified plurality of RF signals.

9. The method of claim 8, wherein the controlling of amplitudes and phases comprises:

demodulating the amplified plurality of RF signals to a plurality of binary phase shift keying (BPSK) signals, respectively;

generating a QPSK signal using two BPSK signals having a phase difference of 90° among the plurality of BPSK signals;

detecting an amplitude error and a phase error by comparing the reference QPSK signal and the generated QPSK signal; and calibrating amplitudes and phases of two RF signals that are related to the generated QPSK signal among the amplified plurality of RF signals with the amplitude error and the phase error.

10. The method of claim 9, wherein the calibrating of amplitudes and phases comprises calibrating a phase and an amplitude of the other RF signal based on one RF signal of the two RF signals.

11. The method of claim 9, wherein the demodulating of the amplified plurality of RF signals comprises:

modulating the reference QPSK signal to an RF signal using the input RF signal; and demodulating a reference QPSK signal that is modulated to the RF signal to the plurality of BPSK signals using each of the amplified plurality of RF signals.

12. The method of claim 11, wherein the demodulating of the amplified plurality of RF signals further comprises changing a phase of a reference QPSK signal that is modulated to the RF signal based on phase delay of the generated QPSK signal.

13. An apparatus that compensates an amplitude and a phase of a multiple signal in a multiport amplifier comprising an input hybrid network that divides an input RF signal to a plurality of RF signals, a plurality of power amplifiers that amplify the plurality of RF signals, and an output hybrid network that generates at least one output signal from the amplified plurality of RF signals, the apparatus comprising:

a modulator that modulates a reference QPSK signal to an RF signal using the input RF signal;

a plurality of BPSK demodulators that generate a plurality of BPSK signals by demodulating the plurality of amplified RF signals;

a QPSK signal generator that generates at least one QPSK signal by coupling two BPSK signals having a phase difference of 90° among the plurality of BPSK signals;

a signal analyzer that detects an amplitude error and a phase error by comparing the reference QPSK signal and each of the at least one generated QPSK signal; and a plurality of amplitude and phase controllers that control amplitudes and phases of the plurality of RF signals according to the amplitude error and the phase error.

14. The apparatus of claim 13, further comprising a signal selector that selects two BPSK signals having a phase difference of 90° among the plurality of BPSK signals.

15. The apparatus of claim 14, further comprising a phase converter that compensates phase delay of the generated QPSK signal.

16. The apparatus of claim 15, wherein the phase converter changes a phase of the reference QPSK signal according to a phase change amount of the generated QPSK signal.

17. The apparatus of claim 14, wherein two amplitude and phase controllers that are related to the generated QPSK signal among the plurality of amplitude and phase controllers perform amplitude and phase control of corresponding RF signals according to the detected amplitude error and phase error.

* * * * *